(12) United States Patent
Tournereau et al.

(10) Patent No.: US 6,280,101 B1
(45) Date of Patent: Aug. 28, 2001

(54) TWO-PART DEVICE AND METHOD FOR PROTECTING OPTOELECTRONIC UNITS

(75) Inventors: Alain Tournereau, Chalette sur Loing; Laurent Liévre, Lardy, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/317,220

(22) Filed: May 24, 1999

(30) Foreign Application Priority Data

May 25, 1998 (EP) ................................................ 98440108

(51) Int. Cl.⁷ ....................................................... G02B 6/36
(52) U.S. Cl. ................................. 385/92; 385/88; 385/89; 385/90; 385/91; 385/94; 350/96.2; 350/96.21; 350/96.22
(58) Field of Search ............................ 385/88–92, 94; 350/96.2, 96.21, 96.22

(56) References Cited

U.S. PATENT DOCUMENTS 5,011,246 * 4/1991 Corradetti et al. .................... 350/96.2
5,390,271 * 2/1995 Priest ...................................... 385/92

FOREIGN PATENT DOCUMENTS

| 0 631 160 A1 | 12/1994 | (EP) . |
| 0 636 909 A1 | 2/1995 | (EP) . |
| 0 661 564 A1 | 7/1995 | (EP) . |
| 0 819 959 A1 | 1/1998 | (EP) . |
| 0 738 908 A2 | 10/1998 | (EP) . |
| 0738908A | * 10/1996 | (JP) . |
| 0819959A | * 1/1998 | (JP) . |

OTHER PUBLICATIONS

Japanese Patent Abstract for Japanese Patent JP 072947679.
Patent Abstract of Japan, vol. 013, No. 499 99P–957), Nov. 10, 1989 corresponding to JP 01 200307 A dated Aug. 11, 1989.

* cited by examiner

Primary Examiner—Frank G. Font
Assistant Examiner—Michael P. Mooney
(74) Attorney, Agent, or Firm—Sughrue, Mion, Zinn, Macpeak & Seas, PLLC

(57) ABSTRACT

A two-part device for protecting optoelectronic units formed or mounted on a substrate is disclosed wherein the units have at least one optical fiber pigtail, and wherein one part of the device has a cutout which corresponds to the shape and size of the optoelectronic unit and is filled with a curable substance adapted to the physical requirements of the optoelectronic unit.

7 Claims, 1 Drawing Sheet

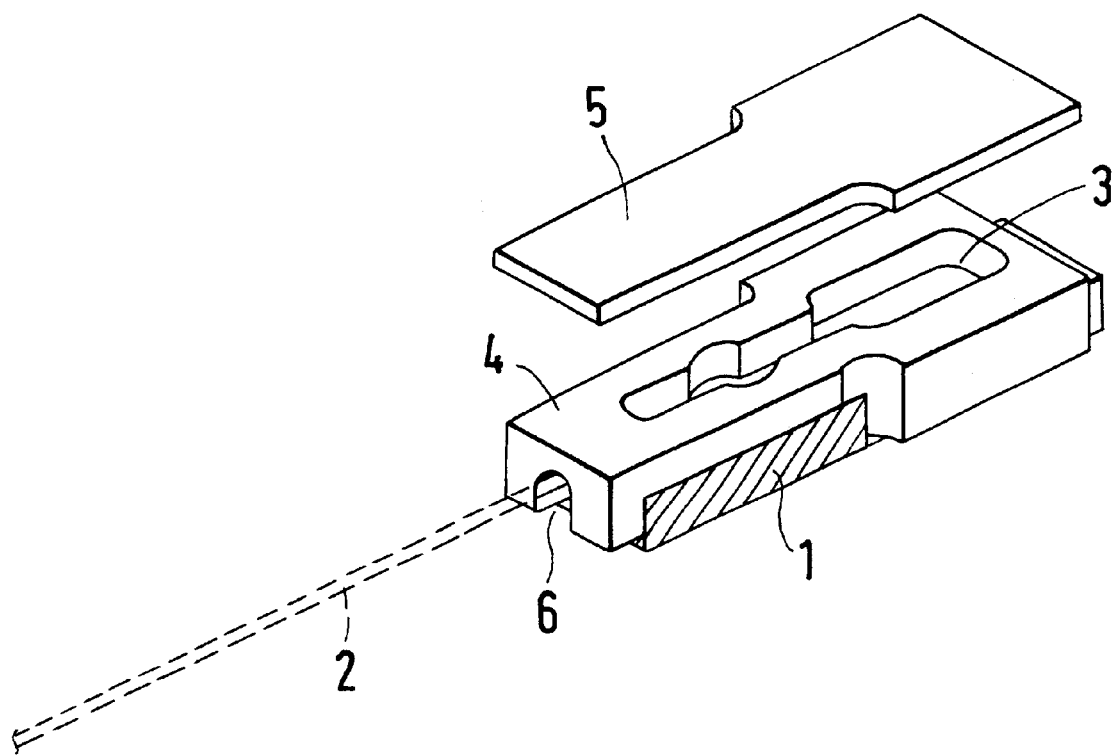

TWO-PART DEVICE AND METHOD FOR PROTECTING OPTOELECTRONIC UNITS

BACKGROUND OF THE INVENTION

This invention relates to a two-part device and a method for protecting optoelectronic units as set forth in the preambles of the respective independent claims.

Optoelectronic units, e.g. photodiodes or laser diodes in combination with their electric and optical connections, must be protected from the surrounding environment. Such protection is provided by housings which are made of metal, ceramic, or plastic. These housings enclose prefabricated units in the form of optoelectronic components and their electric and optical connections. In production, such technical implementations require a multitude of process steps. In addition, the housings, which are subsequently placed around the sensitive optoelectronics, do not offer optimum thermal and physical protection.

JP 07294769 A discloses a protection member which is made of a polymer resin. The member encloses an optical circuit and an optical fiber block which serves to couple light in and out. This member prevents the ingress of moisture and is to provide a certain protection against stresses and shock loading. Such a solution reduces the complexity of the production process. In this method for sealing the optical components, the individual components have already been mounted. The sealing serves to protect the completely assembled unit.

SUMMARY OF THE INVENTION

The two-part device according to the invention with the characterizing features of the first independent claim has the advantage that a housing is prepared which serves to protect the arrangement from external influences, such as shocks and vibrations, and that the housing has a cutout in which the optoelectronic components are precisely positioned realitve to each other and which is filled with a substance adapted to the physical requirements of the optoelectronic unit. The two-part device thus serves a dual function: it provides protection against shock loading and acts as a mold to be filled with the curable substance for physically locating the individual components.

Further advantageous features of the device are defined in the dependent claims.

Advantageously, the curable substance is a polymer. This substance is advantageously adapted to the thermal characteristic and/or the refractive index of the optoelectronic unit and/or the fiber.

Also advantageous is the method for protecting optoelectronic units, since first the optoelectronic unit as well as the optical and electric connections are installed on the substrate, then the device is placed on the substrate, the cutout is filled with the curable substance, and finally the cover of the device is placed on to protect the optoelectronic unit.

BRIEF DESCRIPTION OF THE DRAWING

One embodiment of the invention is illustrated in the accompanying drawing and will now be explained in more detail.

DETAILED DESCRIPTION OF THE INVENTION

The single FIGURE of the drawing shows the construction of the device according to the invention. A lower part 4 of the device has a cutout 3. The lower part 4 rests on the substrate 1 for the optoelectronic unit. It has a groove 6 for pigtail fibers 2. An upper part 5 of the device acts as a cover.

The substrate, normally a silicon substrate, is provided with a V-groove into which an optical fiber pigtail is laid. The groove in the substrate extends to a photodiode or a laser. The end of the pigtail fiber must be positioned very precisely in front of the laser diode or photodiode. The optoelectronic unit itself, together with all connections and the necessary electronics, was produced on the substrate, forming a monolithic module.

In a first step of the production process, a fiber pigtail is laid into the groove of the substrate. Next, the lower part 4 of the device is placed on the substrate 1. The lower part 4 also has a groove for the pigtail fiber. The cutout 3 inside the lower part 4 is precisely adapted to the shape of the optoelectronic unit and the fiber pigtail. The lower part 4 of the device is fixed on the substrate either via matched external dimensions or by tongue-and groove joints. The cutout 3 of the lower part 4, in which the pigtail fiber 2 and the electronic component are precisely positioned relative to each other, is then filled with a polymer. The thermal expansion of the polymer must be adapted to the requirements of both the lower part 4 of the device and the substrate 1. In addition, the polymer should have a refractive index which permits its use between the photodiode and the fiber or between the laser and the fiber. After the polymer has cured, the substrate, the lower part 4 of the device, and the polymer are securely bonded together, thus forming a unit for fixing the pigtail fibers in place and for protecting the optoelectronic units and the fibers against shock and thermal loading. In a last process step, the upper part 5 of the device is placed on as a cover and connected with the lower part 4 in a suitable manner. The cutout 3 of the lower part 4 serves as a "mold" and limits the consumption of polymer required to fix and protect the pigtail fibers.

The two parts of the device, the lower part 4 and the upper part 5, are generally made of plastic and may be additionally metalized to provide electric shielding. This production process for making connections between fiber pigtails and optoelectronic units is easily reproducible and requires only a small quantity of polymer. The shapes of the lower part 4 and the upper part 5 can be readily adapted to the shape of the substrate and can be implemented in very small dimensions. This permits the use of several small lower parts 4 and upper parts 5 of the device in complex electronic systems.

What is claimed is:

1. A device for protecting an optoelectronic unit having at least one optical fiber pigtail, the device comprising:

a lower part having a cutout, wherein the cutout corresponds to a shape and a size of the optoelectronic device and the optical fiber pigtail, and wherein the cutout is filled with a curable substance adapted to physical requirements of the optoelectronic unit and the optical fiber pigtail;

an upper part arranged on the lower part; and a substrate, on which the optoelectronic unit is formed, the substrate having a groove to receive the optical fiber pigtail.

2. The device of claim 1, wherein the optoelectronic unit is mounted on the substrate.

3. The device of claim 1, wherein the curable substance comprises a polymer.

4. The device of claim 1, wherein the physical requirements comprise at least one of a thermal characteristic and a refractive index of the optoelectronic unit and the optical fiber pigtail.

5. The device of claim 1, wherein the lower part is connected to the substrate.

6. The device of claim 1, wherein the outer surfaces of the device are metalized.

7. A method for protecting an optoelectronic unit, which has at least one optical fiber pigtail and which is arranged on a substrate, the method comprising:

placing a lower part on the substrate;

laying the optical fiber pigtail of the optoelectronic unit into a groove to precisely position the optical fiber pigtail relative to the optoelectronic unit;

filling a cutout of the lower part with a curable substance, wherein the cutout corresponds to a shape and size of the optoelectronic unit and the optical fiber pigtail; and covering the lower part with an upper part.

* * * * *